(12) United States Patent
Li et al.

(10) Patent No.: US 9,966,433 B2
(45) Date of Patent: May 8, 2018

(54) MULTIPLE-STEP EPITAXIAL GROWTH S/D REGIONS FOR NMOS FINFET

(71) Applicant: GLOBALFOUNDRIES Inc., Grand Cayman (KY)

(72) Inventors: Zhiqing Li, Halfmoon, NY (US); Shesh Mani Pandey, Saratoga Springs, NY (US); Francis Benistant, Singapore (SG)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/227,330

(22) Filed: Aug. 3, 2016

(65) Prior Publication Data

US 2018/0040696 A1    Feb. 8, 2018

(51) Int. Cl.
| | |
|---|---|
| *H01L 29/08* | (2006.01) |
| *H01L 21/22* | (2006.01) |
| *H01L 29/167* | (2006.01) |
| *H01L 29/16* | (2006.01) |
| *H01L 21/02* | (2006.01) |
| *H01L 29/78* | (2006.01) |
| *H01L 29/66* | (2006.01) |

(52) U.S. Cl.
CPC .... *H01L 29/0847* (2013.01); *H01L 21/02532* (2013.01); *H01L 21/2225* (2013.01); *H01L 29/167* (2013.01); *H01L 29/1608* (2013.01); *H01L 29/66795* (2013.01); *H01L 29/785* (2013.01)

(58) Field of Classification Search
CPC ............. H01L 29/0847; H01L 21/2225; H01L 29/1608; H01L 29/167; H01L 29/785; H01L 29/66795; H01L 21/02532
See application file for complete search history.

(56) References Cited

U.S. PATENT DOCUMENTS

| | | |
|---|---|---|
| 5,091,763 A | 2/1992 | Sanchez |
| 2015/0097197 A1 | 4/2015 | Ganz et al. |
| 2016/0190250 A1* | 6/2016 | Kwok ................. H01L 29/0847 257/77 |

* cited by examiner

*Primary Examiner* — Hoang-Quan Ho

(74) *Attorney, Agent, or Firm* — Ditthavong & Steiner, P.C.

(57) ABSTRACT

A method of forming NFET S/D structures with multiple layers, with consecutive epi-SiP layers being doped at increasing dosages of P and the resulting device are provided. Embodiments include forming multiple epi-Si layers in each S/D cavity of a NFET; and performing in-situ doping of P for each epi-Si layer, wherein consecutive epi-Si layers are doped at increasing dosages of P.

9 Claims, 2 Drawing Sheets

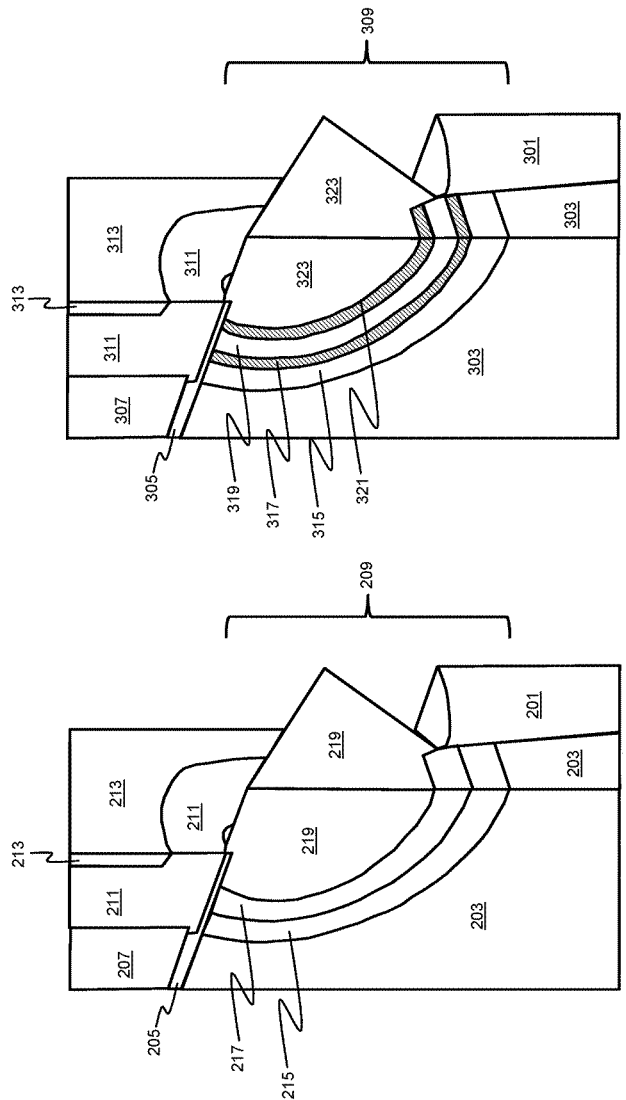

MULTIPLE-STEP EPITAXIAL GROWTH S/D REGIONS FOR NMOS FINFET

TECHNICAL FIELD

The present disclosure relates to the formation of source/drain (S/D) regions by epitaxial growth (epi) for fin-type field-effect transistor (FinFET) devices. The present disclosure is particularly applicable to the 14 nanometer (nm) technology node and beyond where epitaxial S/D is needed.

BACKGROUND

A known approach for fabricating a 14 nm lower-power n-type field-effect transistor (NFET) includes forming the S/D regions with a single epi-silicon phosphorous (epi-SiP) layer that is in-situ doped with a high concentration of phosphorous (P), as depicted in FIG. 1. Adverting to FIG. 1 (an axiomatic view), an STI region 101 is formed between fin 103 and an adjacent fin (not shown for illustrative convenience). A gate dielectric layer 105 and a gate structure 107 are then formed over the fin 103 between a high P concentration epi-SiP S/D region 109 and a second S/D region (not shown for illustrative convenience), with spacers 111 and 113 on each side of the gate structure 107. The high P concentration in the epi-SiP S/D region 109 is good for boosting the direct current (DC) performance of the device. However, such concentrations also create an abrupt P dopant concentration transition from the channel to the extension region and induce strong band to band generation, both of which are a root cause of low breakdown voltage (BV) and high substrate current (Isub) in these kind of devices.

The traditional approach for solving these problems is tuning the implant conditions to reduce the steepness of the doping profiles. However, tuning the halo/extension/pre-ion implant/S/D implant conditions without largely degrading the DC performance of the device results in only a limited improvement of BV and Isub of the device.

A need therefore exists for methodology enabling formation of a graded P dopant concentration distribution from the channel to the extension region of an NFET, and the resulting device.

SUMMARY

An aspect of the present disclosure is a method of forming multiple-step epi-SiP S/D structures with consecutive epi-Si layers being doped at increasing dosages of P.

Another aspect of the present disclosure is a method of forming multiple-step epi-silicon carbon (epi-SiC)/epi-SiP structures with consecutive epi-SiP layers being doped with increasing dosages of P.

A further aspect of the present disclosure is a device having multiple-step epi-SiP or epi-SiC/epi-SiP S/D structures with consecutive epi-SiP layers being doped with increasing dosages of P.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming multiple epi-Si layers in each S/D cavity of a NFET; and performing in-situ doping of P for each epi-Si layer, wherein consecutive epi-Si layers are doped at increasing dosages of P.

Aspects of the present disclosure include performing each of the P doping at a dosage of 1e18 per centimeter cubed ($cm^3$) to $1e21/cm^3$. Other aspects include forming two epi-Si layers, each layer formed to a thickness of approximately one-half of a depth of each S/D cavity. Further aspects include forming three epi-Si layers, each layer formed to a thickness of approximately one-third of a depth of each S/D cavity. Another aspect includes forming an additional epi-Si layer in each S/D cavity prior to each epi-Si layer or between each pair of epi-Si layers and performing in-situ doping of carbon (C) for each additional epi-Si layer. Additional aspects include forming two or three epi-Si layers and two additional epi-Si layers. Other aspects include forming each additional epi-Si layer to a thickness of about one half of a thickness of each epi-Si layer. Further aspects include forming each additional epi-Si layer to a thickness greater than or equal to 1 nm and less than a thickness of each epi-Si layer. Another aspect includes performing each C doping and each P doping at a dosage of $1e18/cm^3$ to $1e21/cm^3$.

Another aspect of the present disclosure is a device including: a nFET having S/D regions, each S/D region including multiple layers of epi-SiP, each SiP layer having a greater concentration of P than an adjacent lower SiP layer. Aspects of the device include each Si layer being doped with P at a dosage of $1e18/cm^3$ to $1e21/cm^3$. Other aspects include two epi-SiP layers, each having a thickness of approximately one-half of a depth of each S/D region. Further aspects include three epi-SiP layers, each having a thickness of approximately one-third of a depth of each S/D region. Additional aspects include an epi-SiC layer prior to each epi-SiP layer or between each pair of adjacent epi-SiP layers. Another aspect includes two epi-SiC layers and two or three epi-SiP layers. Other aspects include each epi-SiC layer having a minimum thickness of one nm. Further aspects include each epi-SiC layer being doped with C at a dosage of $1e18/cm^3$ to $1e21/cm^3$, and each epi-SiP layer being doped with P at a dosage of $1e18/cm^3$ to $1e21/cm^3$.

A further aspect of the present disclosure is a method including: forming three epi-Si layers in each S/D cavity of a NFET, each epi-Si layer formed to a thickness of approximately one-third of a depth of each S/D cavity; and performing in-situ doping of P for each epi-Si layer, wherein consecutive epi-Si layers are doped at increasing dosages of P between $1e18/cm^3$ to $1e21/cm^3$. Aspects of the present disclosure include forming two additional epi-Si layers in each S/D cavity, each additional layer formed between a pair of adjacent epi-layers and formed to a thickness of about one half of a thickness of each epi-Si layer; and performing in-situ doping of C at a dosage of $1e18/cm^3$ to $1e21/cm^3$ for each additional epi-Si layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 2 schematically illustrates a multi-step epi-SiP NFET device, in accordance with an exemplary embodiment; and FIG. 3 schematically illustrates a multi-step epi-SiC/epi-SiP NFET device, in accordance with an exemplary embodiment.

DETAILED DESCRIPTION

Figure 1:
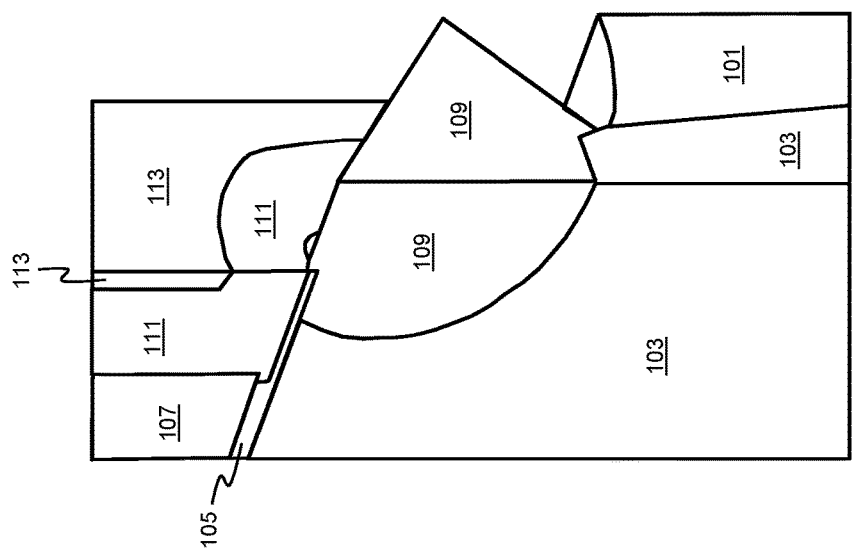
FIG. 1 schematically illustrates a background epi-SiP NFET device.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of an abrupt P dopant concentration transition from the channel to the extension region of an NFET, which induces strong band to band generation, low BV, and high Isub attendant upon forming NFET epi-SiP S/D regions.

Methodology in accordance with embodiments of the present disclosure includes forming multiple epi-Si layers in each S/D cavity of a NFET. An in-situ doping of P at increasing dosages of P from one layer to the next is performed for each epi-Si layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIG. 2 (an axiomatic view) schematically illustrates a multi-step epi-SiP NFET device, in accordance with an exemplary embodiment. Adverting to FIG. 2, an STI region 201 is formed between fin 203 and an adjacent fin (not shown for illustrative convenience). A gate dielectric layer 205 and a gate structure 207 are formed over fin 203 between S/D cavity 209 and a second S/D cavity (not shown for illustrative convenience), with spacers 211 and 213 on each side of the gate structure 207. Thereafter, an epi-Si layer is formed in the S/D cavity 209 of the fin 203. The epi-Si layer is formed, e.g., to a thickness of approximately one-third of the depth of the S/D cavity 209 with approximately 50% variation. The S/D cavity 209 for epi-SiP growth is usually ball-shaped or U-shaped with a depth, e.g., of approximately 35 nm with approximately 20% of variation for current 14 nm technology. An in-situ doping of P is performed for the epi-Si layer, e.g., at a dosage of $1e18/cm^3$ to $1e21/cm^3$, forming the epi-SiP layer 215. A second epi-Si layer is then formed, e.g., to a thickness of approximately one-third of the depth of the S/D cavity 209 with approximately 50% variation, over the epi-SiP layer 215. An in-situ doping of P is performed at a dosage higher than $1e18/cm^3$, but less than or equal to $1e21/cm^3$, forming the epi-SiP layer 217. A third epi-Si layer is then formed, e.g., to a thickness of approximately one-third of the depth of the S/D cavity 209 with approximately 50% variation, over the epi-SiP layer 217. An in-situ doping of P is performed at a dosage greater than or equal to the epi-SiP layer 217, e.g., less than or equal to $1e21/cm^3$, forming the epi-SiP layer 219. The thickness of each epi-SiP layer may increase from the bottom to the top of the S/D cavity 209 as the P concentration increases.

Although three epi-SiP layers, e.g., epi-SiP layers 215, 217, and 219, are formed in FIG. 2, two epi-SiP layers (not shown for illustrative convenience) could alternatively be formed in the S/D cavity 209. When two epi-SiP layers are formed, each epi-Si layer is formed, e.g., to a thickness of approximately one-half of the depth of the S/D cavity 209 with 50% of variation, and each consecutive epi-Si layer is doped with a dosage of P greater than the previous layer, but still between $1e18/cm^3$ and $1e21/cm^3$.

FIG. 3 (an axiomatic view) schematically illustrates a multi-step epi-SiC/epi-SiP NFET device, in accordance with another exemplary embodiment. FIG. 3 is similar to FIG. 2; however, instead of three or two consecutive epi-Si layers doped with P, an additional epi-Si layer doped with C may be added between each pair of adjacent epi-SiP layers. Adverting to FIG. 3, an STI region 301 is formed between fin 303 and an adjacent fin (not shown for illustrative convenience). A gate dielectric layer 305 and a gate structure 307 are formed over fin 303 between S/D cavity 309 and a second S/D cavity (not shown for illustrative convenience), with spacers 311 and 313 on each side of the gate structure 307. Thereafter, an epi-Si layer is formed in the S/D cavity 309 of the fin 303. The epi-Si layer is formed, e.g., to a thickness slightly greater than one-fifth of the depth of the S/D cavity 309 with 50% variation. An in-situ doping of P is performed, e.g., at a dosage equal to or greater than $1e18/cm^3$ and less than $1e21/cm^3$, forming the epi-SiP layer 315. Next, a second epi-Si layer is formed, e.g., to a thickness of approximately one-half of the thickness of the epi-SiP layer 315 with 50% variation, e.g., a thickness greater than or equal to 1 nm and less than the thickness of the epi-SiP layer 315. An in-situ doping of C is performed, e.g., at a dosage of $1e18/cm^3$ to $1e21/cm^3$, forming the epi-SiC layer 317. A third epi-Si layer is then formed over the epi-SiC layer 317, e.g., to a thickness approximately the same as the thickness of the epi-SiP layer 315. An in-situ doping of P is performed at a concentration higher than the dosage of the epi-SiP layer 315, e.g., at dosage greater than $1e18/cm^3$ and less than $1e21/cm^3$, forming the epi-SiP layer 319. Thereafter, epi-SiC layer 321 and epi-SiP layer 323 are formed in the same manner as epi-SiC layer 317 and epi-SiP layer 319, respectively; however, the in-situ doping for the epi-SiP layer 323 is at a greater P dopant concentration than for the epi-SiP layer 319, e.g., greater than $1e18/cm^3$ and less than or equal to $1e21/cm^3$. Again, the thickness of each epi-SiP layer may increase from the bottom to the top of the S/D cavity 309 as the P concentration increases. In this instance, the epi-SiC layers 317 and 321 are doped at approximately the same dosage of C, e.g., $1e18/cm^3$ to $1e21/cm^3$.

Although an in-situ doping of P is performed with respect to the first epi-Si layer formed in the S/D cavity 309, e.g., epi-SiP layer 315, in FIG. 3, the first epi-SiP layer may alternatively be eliminated, making the epi-SiC layer 317 first. However, regardless of whether the first epi-Si layer formed in the S/D cavity 309 is in-situ doped with P or C, the last epi-Si layer formed in the S/D cavity 309 must be in-situ doped with P.

The embodiments of the present disclosure can achieve several technical effects including achieving a graded P dopant distribution from the channel to the extension region of an NFET and thereby increase BV and decrease Isub of the device. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in 14 nm technology node devices and beyond where epitaxial S/D is needed.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming multiple epitaxially grown (epi) silicon (Si) layers in each source/drain (S/D) cavity of a n-type field effect transistor (NFET);
    performing in-situ doping of phosphorous (P) for each epi-Si layer, wherein consecutive epi-Si layers are doped at increasing dosages of P,
        wherein two epi-Si layers are formed, each layer formed to a thickness of approximately one-half of a depth of each S/D cavity.

2. The method according to claim 1, comprising performing each of the P doping at a dosage of 1e18 per centimeter cubed ($cm^3$) to $1e21/cm^3$.

3. The method according to claim 1, further comprising:
    forming an additional epi-Si layer in each S/D cavity prior to each epi-Si layer or between each pair of epi-Si layers and performing in-situ doping of carbon (C) for each additional epi-Si layer.

4. The method according to claim 3, comprising forming two or three epi-Si layers and two additional epi-Si layers.

5. The method according to claim 3, comprising forming each additional epi-Si layer to a thickness of about one half of a thickness of each epi-Si layer.

6. The method according to claim 3, comprising forming each additional epi-Si layer to a thickness greater than or equal to 1 nanometer (nm) and less than a thickness of each epi-Si layer.

7. The method according to claim 3, comprising performing each C doping and each P doping at a dosage of 1e18 per centimeter cubed ($cm^3$) to $1e21/cm^3$.

8. A method comprising:
    forming three epitaxially grown (epi) silicon (Si) (epi-Si) layers in each source/drain (S/D) cavity of a n-type field effect transistor (NFET), each epi-Si layer formed to a thickness of approximately one-third of a depth of each S/D cavity; and
    performing in-situ doping of phosphorous (P) for each epi-Si layer, wherein consecutive epi-Si layers are doped at increasing dosages of P between 1e18 per centimeter cubed ($cm^3$) to $1e21/cm^3$.

9. The method according to claim 8, further comprising:
    forming two additional epi-Si layers in each S/D cavity, each additional layer formed between a pair of adjacent epi-layers and formed to a thickness of about one half of a thickness of each epi-Si layer; and
    performing in-situ doping of carbon (C) at a dosage of 1e18 per centimeter cubed ($cm^3$) to $1e21/cm^3$ for each additional epi-Si layer.

* * * * *